(12) United States Patent
Kamada et al.

(10) Patent No.: US 11,495,290 B2
(45) Date of Patent: Nov. 8, 2022

(54) MEMORY SYSTEM AND POWER SUPPLY CIRCUIT WITH POWER LOSS PROTECTION CAPABILITY

(71) Applicant: Kioxia Corporation, Tokyo (JP)

(72) Inventors: Daiki Kamada, Yokohama (JP); Kengo Kumagai, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/199,830

(22) Filed: Mar. 12, 2021

(65) Prior Publication Data

US 2022/0093173 A1 Mar. 24, 2022

(30) Foreign Application Priority Data

Sep. 18, 2020 (JP) .............................. JP2020-157520

(51) Int. Cl.
*G11C 11/56* (2006.01)
*G11C 11/4093* (2006.01)
*G11C 11/4074* (2006.01)

(52) U.S. Cl.
CPC ...... *G11C 11/5628* (2013.01); *G11C 11/4074* (2013.01); *G11C 11/4093* (2013.01)

(58) Field of Classification Search
CPC ............ G11C 11/5628; G11C 11/4074; G11C 11/4093
See application file for complete search history.

(56) References Cited

U.S. PATENT DOCUMENTS

| 10,102,916 B1 | 10/2018 | Kao et al. |
| 2019/0041938 A1 | 2/2019 | Zupanc et al. |
| 2019/0324859 A1 | 10/2019 | Armstrong et al. |

FOREIGN PATENT DOCUMENTS

| CN | 106602865 A | * | 4/2017 |
| CN | 110333828 A | | 10/2019 |
| JP | 2016-115171 A | | 6/2016 |
| KR | 100215760 B1 | * | 8/1999 |
| TW | 201901692 A | | 1/2019 |

* cited by examiner

*Primary Examiner* — Sultana Begum
(74) *Attorney, Agent, or Firm* — Oblon, McClelland, Maier & Neustadt, L.L.P.

(57) ABSTRACT

A power supply circuit supplies a first voltage to a third terminal using a voltage of a first terminal, generates a second voltage using the first voltage, supplies the second voltage to a non-volatile memory, generates a third voltage using the first voltage, charges energy in a capacitor, upon the voltage of the first terminal being lower than a first threshold voltage and a voltage of the second terminal being higher than a second threshold voltage, supplies a fourth voltage using charged energy to the third terminal, and upon the voltage of the second terminal being lower than the second threshold voltage, stops charging and supplies a fifth voltage using the charged energy to the third terminal.

32 Claims, 4 Drawing Sheets

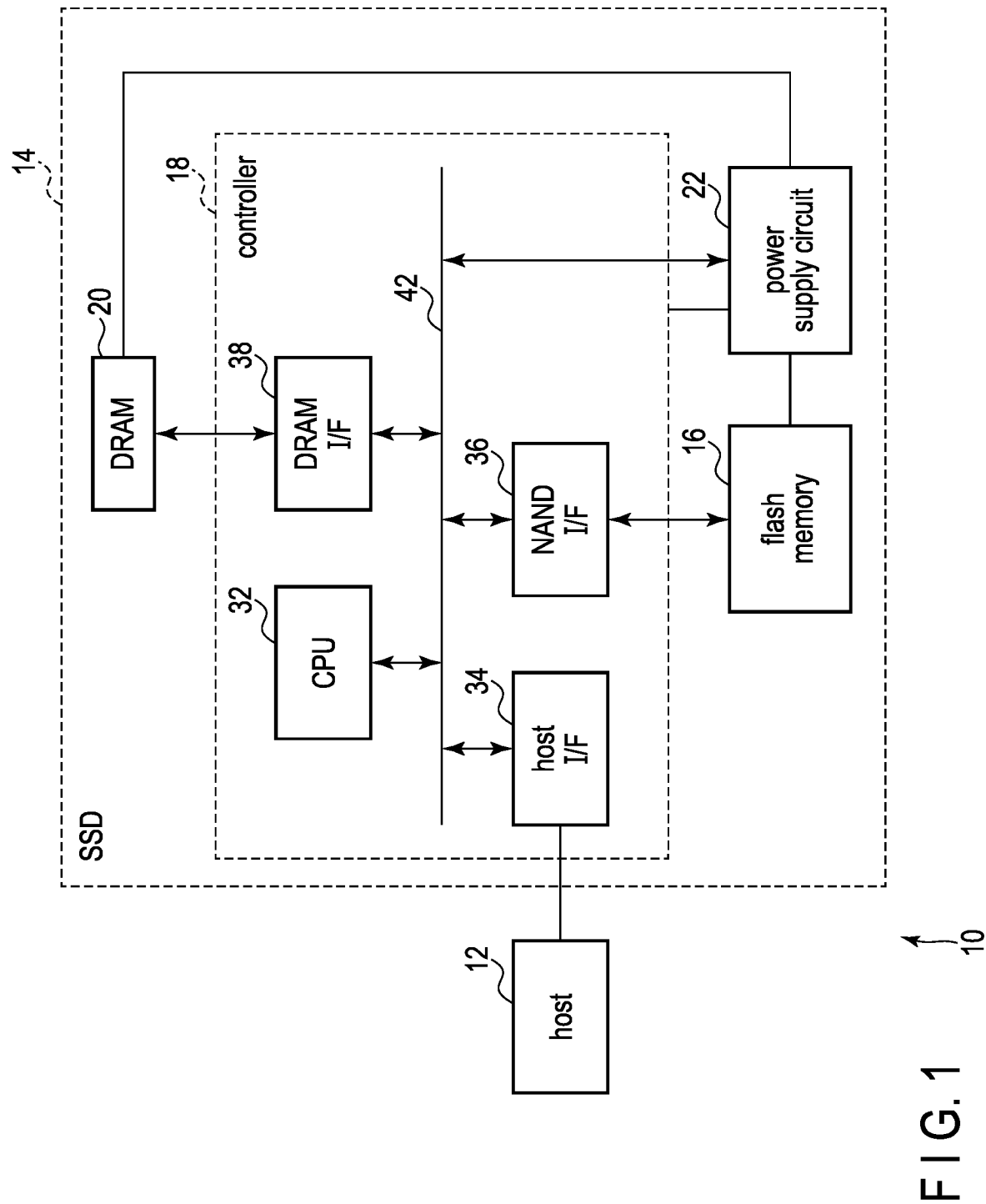
F I G. 1

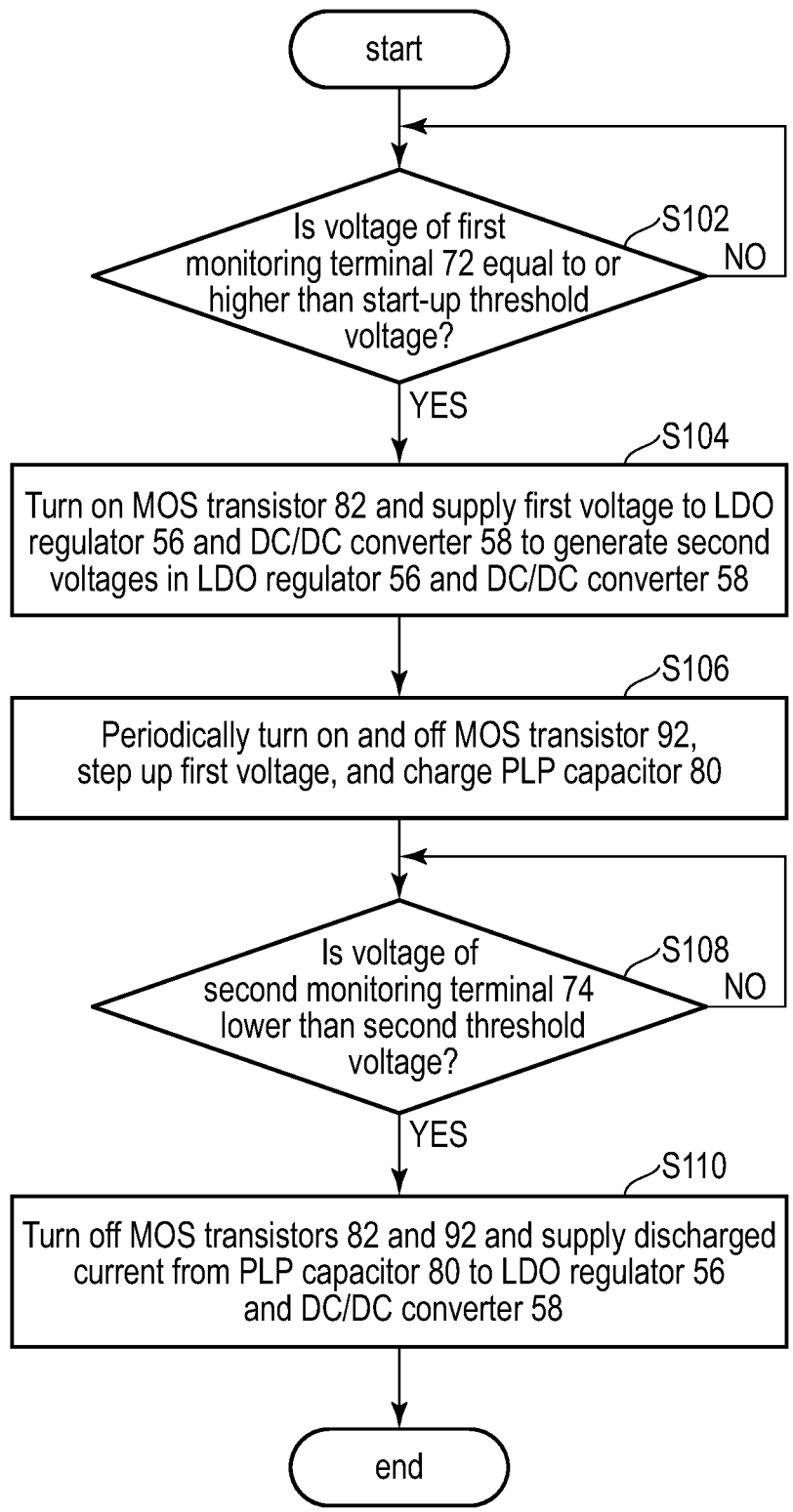
F I G. 3

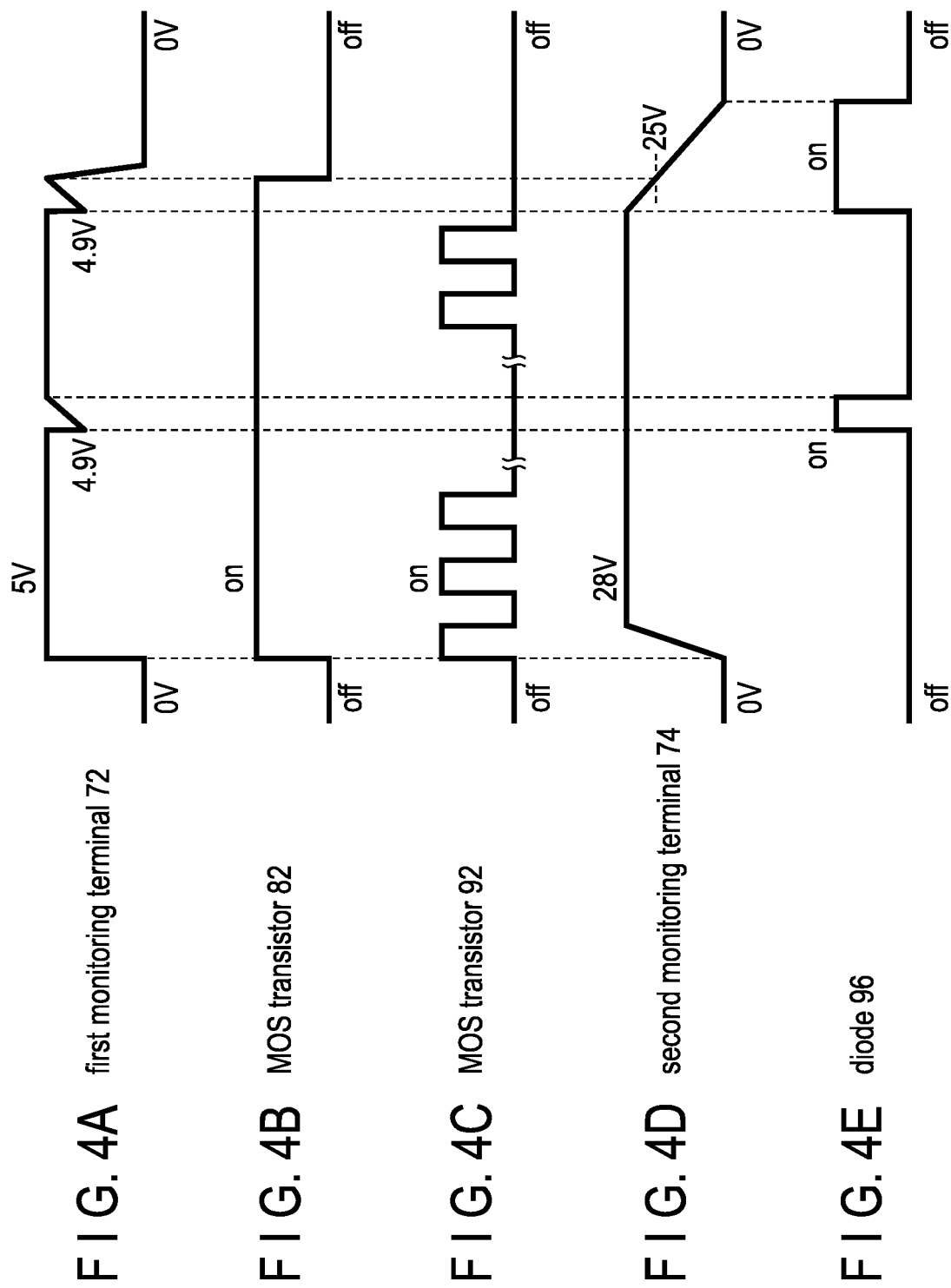
F I G. 4A  first monitoring terminal 72
F I G. 4B  MOS transistor 82
F I G. 4C  MOS transistor 92
F I G. 4D  second monitoring terminal 74
F I G. 4E  diode 96

MEMORY SYSTEM AND POWER SUPPLY CIRCUIT WITH POWER LOSS PROTECTION CAPABILITY

CROSS-REFERENCE TO RELATED APPLICATIONS

This application is based upon and claims the benefit of priority from Japanese Patent Application No. 2020-157520, filed Sep. 18, 2020, the entire contents of which are incorporated herein by reference.

FIELD

Embodiments described herein relate generally to a memory system and a power supply circuit.

BACKGROUND

Memory systems including non-volatile memories are widely used. As an example of such a memory system, a solid state drive (SSD) including a flash memory is known.

Some types of SSDs have a power loss protection (PLP) function to prevent data loss when power is unintentionally shut down. When the voltage of a power supply is dropped by power failure and the like, the PLP function uses electrical energy (simply referred to as energy below) of a capacitor as a backup power supply to write data into the flash memory and to prevent data loss during writing.

A peak current may be required in the SSD. Due to the peak current, the voltage of the power supply may drop and the PLP function may be triggered to operate. In such a case, since the power supply itself is normal, the PLP function is not required to operate. The operation of the PLP function in such a situation is referred to as an erroneous operation. When the PLP function erroneously operates, processing that should have not been required is performed in the SSD.

BRIEF DESCRIPTION OF THE DRAWINGS

FIG. 1 is a block diagram illustrating an example of an information processing system including a memory system according to an embodiment.

FIG. 3 is a flowchart illustrating an example of the operation of the power supply circuit.

FIGS. 4A, 4B, 4C, 4D, and 4E show a timing chart illustrating an example of the operation of the power supply circuit.

DETAILED DESCRIPTION

Figure 2:
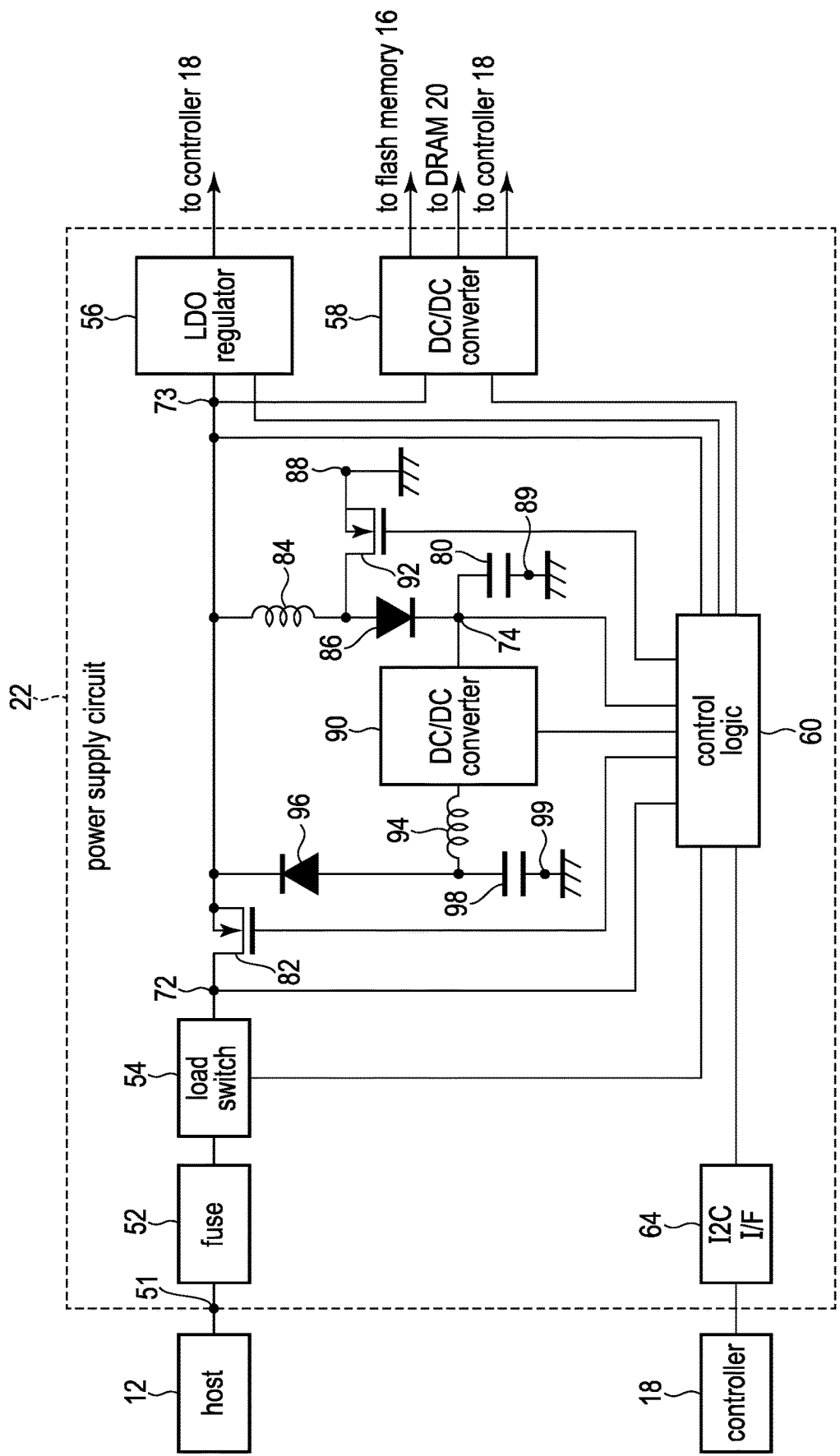
FIG. 2 is a circuit diagram illustrating an example of a power supply circuit.

Various embodiments will be described hereinafter with reference to the accompanying drawings.

The disclosure is merely an example and the scope of the invention is not limited by contents of the embodiments described below. Modification which is easily conceivable by a person of ordinary skill in the art comes within the scope of the invention. In order to make the description clearer, the sizes, shapes and the like of the respective parts may be changed to schematically illustrate the embodiments. Constituent elements corresponding to each other in a plurality of drawings are denoted by like (or same) reference numerals and their detailed descriptions may be omitted unless necessary.

In general, according to one embodiment, a memory system comprises a first terminal, a non-volatile memory, a capacitor having a second terminal, and a power supply circuit having a third terminal. The power supply circuit is configured to supply a first voltage to the third terminal on the basis of a voltage supplied to the first terminal, generate at least one second voltage using the first voltage, supply the at least one second voltage to the non-volatile memory, generate a third voltage using the first voltage, charge energy in the capacitor by supplying the third voltage to the second terminal, upon the voltage supplied to the first terminal being equal to or lower than a first threshold voltage and a voltage of the second terminal being higher than a second threshold voltage, supply a fourth voltage depending on energy of the capacitor to the third terminal while continuing charging of the capacitor, and upon the voltage of the second terminal being equal to or lower than the second threshold voltage, stop charging of the capacitor and supply a fifth voltage depending on the energy of the capacitor to the third terminal. The third voltage is higher than the first voltage, and the second threshold voltage is higher than the first threshold voltage.

<System Configuration>

FIG. 1 is a block diagram illustrating an example of an information processing system including a memory system according to an embodiment. The memory system is a semiconductor storage device configured to write data into a non-volatile memory and read data from the non-volatile memory. An example of the memory system is an SSD. Examples of the non-volatile memory include a NAND flash memory, a NOR flash memory, a magneto-resistive random access memory (MRAM), a phase change random access memory (PRAM), a resistive random access memory (ReRAM), and a ferroelectric random access memory (FeRAM). In the present specification, the non-volatile memory is a NAND type flash memory (simply referred to as a flash memory below).

The information processing system 10 includes a host device (simply referred to as a host below) 12 and an SSD 14. The host 12 is an information processing device that accesses the SSD 14. The host 12 may be a server (storage server) or a personal computer. The SSD 14 may be embedded in a server for business use such as a data center. The SSD 14 may be embedded in a personal computer for personal use.

The SSD 14 may be used as a main storage of the host 12. The SSD 14 may be built in the host 12. The SSD 14 may be provided outside the host 12 and be connected to the host 12 by a cable or via a network.

The SSD 14 includes a flash memory 16, a controller 18, a dynamic random access memory (DRAM) 20, a power supply circuit 22, and the like.

The controller 18 functions as a memory controller configured to control the flash memory 16. The controller 18 may be implemented as a circuit such as a system on a chip (SoC). The controller 18 writes data into the flash memory 16 or reads data from the flash memory 16 in accordance with a command from the host 12. The controller 18 generates control signals for controlling values of voltages generated by the power supply circuit 22, in accordance with the command from the host 12 and various types of information from the power supply circuit 22. The controller 18 transmits the generated control signals to the power supply circuit 22. Thus, the controller 18 controls the generation of a plurality of voltages to be supplied to the devices (for example, the flash memory 16, the controller 18, and the DRAM 20) of the SSD 14.

The DRAM 20 is an example of a volatile memory. The DRAM 20 is, for example, a DRAM of the double data rate 3 low voltage (DDR3L) standard. As the volatile memory, a static random access memory (SRAM) may be used instead of the DRAM 20. The DRAM 20 may be provided in the controller 18. In the DRAM 20, a write buffer, a read buffer, a cache area of a look-up table (LUT), and a storage area of system management information may be provided.

The write buffer is a buffer area for temporarily storing data which is supplied from the host 12 and is to be written into the flash memory 16 until writing of the data is completed. That is, the write buffer stores the data being written. Since the DRAM 20 is a volatile memory, the data being written is lost when the power supply of the SSD 14 is shut down.

The read buffer is a buffer area for temporarily storing data read from the flash memory 16.

The cache area of the LUT is an area for caching the LUT. The LUT is a correspondence table for mapping between a logical address designated by the host 12 and a physical address of the flash memory 16. The LUT is also referred to as an address translation table or a logical/physical address translation table.

The system management information includes various types of information and various tables used during the operation of the SSD 14.

The flash memory 16 may include a plurality of flash memory chips (also referred to as flash memory dies). The flash memory 16 may include a memory cell array including a plurality of memory cells arranged in a matrix. The flash memory 16 may have a two-dimensional structure or a three-dimensional structure.

The memory cell array included in the flash memory 16 includes a plurality of blocks. Each of the blocks includes a plurality of pages. The block functions as the smallest unit for an erase operation. Each of the pages includes a plurality of memory cells connected to the same word line. The page functions as a unit for a write operation and a read operation.

The write buffer or the read buffer has the storage capacity of data for one page. In data writing, the data of a writing unit (i.e., one page), which is read from the write buffer is written into the flash memory 16. In data reading, the data of a reading unit (i.e., one page), which is read from the flash memory 16 is written into the read buffer. A word line may be used as a unit for the writing operation or the reading operation instead of the page. In this case, data for one word line is data in the writing unit or the reading unit.

The power supply circuit 22 uses power from an external device (for example, the host 12) connected to the SSD 14. A first voltage output from the power supply of the host 12 is supplied to the power supply circuit 22 via a connector (not illustrated). The power supply circuit 22 (more specifically, an LDO regulator 56 and a DC/DC converter 58 in the power supply circuit 22, which are to be described with reference to FIG. 2) uses the first voltage to generate a plurality of second voltages required for the devices of the SSD 14, and supplies the generated plurality of second voltages to the devices of the SSD 14. The power supply circuit 22 may include a capacitor (also referred to as a PLP capacitor below) as a backup power supply to realize the PLP function. Details will be described with reference to FIG. 2.

The controller 18 includes a CPU 32, a host interface (host I/F) 34, a NAND interface (NAND I/F) 36, a DRAM interface (DRAM I/F) 38, and the like.

The CPU 32, the host I/F 34, the NAND I/F 36, and the DRAM I/F 38 are connected to a bus line 42. The CPU 32 executes firmware stored in the flash memory 16 to realize various functions.

The host 12 is electrically connected to the host I/F 34. The flash memory 16 is electrically connected to the NAND I/F 36. The DRAM 20 is electrically connected to the DRAM I/F 38.

The host I/F 34 complies with standards such as the small computer system interface (SCSI), serial attached SCSI (SAS), AT attachment (ATA), serial ATA (SATA), PCI Express (PCIe)™, Ethernet™, Fibre channel, NVM Express (NVMe)™, Universal Serial Bus (USB)™, and Universal Asynchronous Receiver/Transmitter (UART)™.

The NAND I/F 36 complies with standards such as Toggle DDR and the Open NAND Flash Interface (ONFI). The NAND I/F 36 controls the flash memory 16. The NAND I/F 36 may be connected to a plurality of flash memory chips in the flash memory 16 via a plurality of channels.

<Example of Power Supply Circuit>

FIG. 2 is a circuit diagram illustrating an example of the power supply circuit 22. The power supply circuit 22 may include one or a plurality of integrated circuits (ICs). The integrated circuits are also referred to as power management ICs (PMICs). Numerical values of the voltage are described for convenience of explanation below, but the numerical values are examples and can be freely changed. The number of second voltages to be generated is also an example and can also be freely changed. The first voltage output by the host 12 is, for example, DC 5V (or DC 3.3V). In the following description, the notation of DC is omitted. The host 12 may output not only a single first voltage but also a plurality of first voltages.

When the first voltage (5V) output from the host 12 is supplied to an input terminal 51 of the power supply circuit 22, a current corresponding to the input voltage passes through a fuse 52, a load switch 54, and a metal-oxide-semiconductor field-effect transistor (MOSFET) (referred to as an MOS transistor) 82 in series and then is supplied to the low dropout (LDO) regulator 56 and the DC/DC converter 58.

The fuse 52 includes a metal fuse. The fuse 52 is blown when an overcurrent, which is equal to or higher than a predetermined current, flows. When the fuse 52 is blown, the input current does not flow through the load switch 54 unless the fuse 52 is replaced. The fuse 52 is not limited to the metal fuse, and an electronic fuse that turns off when an overcurrent is detected may be used.

The load switch 54 is a switch which is turned on/off by a control logic 60. In an initial state, the control logic 60 turns on the load switch 54. In the on-state (conducting state), the load switch 54 outputs a voltage obtained by subtracting a dropout voltage from the input voltage. For convenience of explanation, here, the dropout voltage is 0V. The output voltage of the load switch 54 is 5V in the on-state. The control logic 60 turns off the load switch 54 when the voltage of a second monitoring terminal 74 is equal to or lower than a second threshold voltage (described later). In the off-state (non-conducting state), the output voltage of the load switch 54 is 0V. The output terminal 72 of the load switch 54 is a terminal for monitoring the first voltage supplied from the host 12. The output terminal 72 is also referred to as a first monitoring terminal 72 below. The first monitoring terminal 72 is connected to the control logic 60.

Power may be supplied to the control logic 60 through a terminal (not illustrated) different from the input terminal 51. Accordingly, the control logic 60 can operate even when the first voltage is not supplied to the input terminal 51. The host 12 may supply a voltage to the control logic 60 via a terminal other than the input terminal 51 (not illustrated).

The gate terminal of the MOS transistor 82 is connected to the control logic 60. In FIG. 2, the MOS transistor 82 is illustrated as an n-channel transistor, but a p-channel MOS transistor may be used.

The control logic 60 switches the state of the MOS transistor 82 between the on-state and the off-state in accordance with the change of the voltage of the first monitoring terminal 72 (i.e., the output terminal of the load switch 54) or the second monitoring terminal 74.

The control logic 60 compares the voltage of the first monitoring terminal 72 with a start-up threshold voltage. The start-up threshold voltage is set to the first voltage (5V) to be supplied to the input terminal 51 by the host 12.

When the voltage of the first monitoring terminal 72 is lower than the start-up threshold voltage, the control logic 60 turns off the MOS transistor 82. No voltage is supplied to the input terminal 73 of the LDO regulator 56 and the DC/DC converter 58. Thus, the LDO regulator 56 and the DC/DC converter 58 do not generate a voltage, and the SSD 14 does not operate.

When the voltage of the first monitoring terminal 72 is equal to or higher than the start-up threshold voltage, the control logic 60 turns on the MOS transistor 82. The voltage of 5V is supplied to the input terminal 73 of the LDO regulator 56 and the DC/DC converter 58. Thus, the LDO regulator 56 and the DC/DC converter 58 generate a plurality of second voltages. The SSD 14 operates using the generated plurality of second voltages.

The LDO regulator 56 is a circuit that outputs a voltage for a device of SSD 14 that requires a relatively small current. The DC/DC converter 58 is a circuit that outputs a voltage for a device of the SSD 14 that requires a relatively large current. The LDO regulator 56 and the DC/DC converter 58 may be implemented as individual ICs or a single IC.

The LDO regulator 56 steps down the voltage of the input terminal 73 (5V) to generate a plurality of second voltages, for example, two second voltages of 3.3V and 2.5V. When a voltage of 3.3V is supplied to the input terminal 51 from the host 12 instead of 5V, the input voltage of 3.3V itself may be output from the LDO regulator 56 as the second voltage of 3.3V. The voltages of 3.3V and 2.5V are supplied to the controller 18.

The DC/DC converter 58 steps down the voltage of the input terminal 73 (5V) to generate a plurality of second voltages, for example, four second voltages of 2.8V, 1.8V, 1.35V, and 1V. For example, the voltages of 2.8V and 1.8V are supplied to the flash memory 16, the voltage of 1.35V is supplied to the DRAM 20, and the voltage of 1V is supplied to the controller 18.

Each of the LDO regulator 56 and the DC/DC converter 58 may generate a single second voltage. The power supply circuit 22 does not have to include both the LDO regulator 56 and the DC/DC converter 58, and may include only one of the LDO regulator 56 and the DC/DC converter 58. In this case, the power supply circuit 22 may generate a single second voltage.

Each of the LDO regulator 56 and the DC/DC converter 58 includes a single or a plurality of switching elements. The control logic 60 turns on and off the switching elements of the LDO regulator 56 and the DC/DC converter 58. The control logic 60 adjusts a ratio (duty ratio) between the on-period and the off-period of each switching element in the LDO regulator 56 and the DC/DC converter 58 in accordance with the voltage of the input terminal 73, and changes the step-down ratio of the voltage. Thus, even though the value of the first voltage output from the host 12 slightly fluctuates, the LDO regulator 56 and the DC/DC converter 58 can correctly generate a plurality of second voltages having a predetermined voltage value.

When the host 12 receives from a user an instruction to shut down the power, the host 12 transmits a notification of power shutdown to the SSD 14 before actually shutting down the power. In response to the notification, the controller 18 writes data that is stored in the DRAM 20 and is being written, to the flash memory 16. When the writing is completed, the controller 18 transmits a write completion report to the host 12. The host 12 waits for the write completion report and then shuts down the power. Therefore, the data being written is not lost.

However, when the power supply of the host 12 is unintentionally shut down by due to power failure or the like, the host 12 cannot transmit the notification of power shutdown to the SSD 14. Since the controller 18 does not receive the notification, the controller 18 cannot complete the writing of the data being written into the flash memory 16.

In order to handle the unintended power shutdown, the power supply circuit 22 includes a PLP capacitor 80 as a backup power supply. The power supply circuit 22 compares the voltage of the second monitoring terminal 74 (described later) with the second threshold voltage to detect the shutdown of the power. When the power supply circuit 22 detects the power shutdown by detecting that the voltage of the second monitoring terminal 74 is equal to or lower than the second threshold voltage, the power supply circuit 22 uses the energy in the PLP capacitor 80 to supply voltages to devices of the SSD 14. Thus, the PLP function of writing the data being written into the flash memory 16 is performed.

The capacitance of the PLP capacitor 80 is set to be slightly larger than the target capacitance for charging the energy required to realize the PLP function. If the capacitance of the PLP capacitor 80 has a margin, it is possible to realize the PLP function even though the capacitance of the capacitor is slightly reduced due to aged deterioration. It is possible to suppress the failure rate of the SSD 14 to be low accordingly. For example, for preparing for the capacitance being reduced by within 30% of the initial capacitance, the initial capacitance of the PLP capacitor 80 should be set to about 1.43 times the target capacitance for realizing the PLP function. As the PLP capacitor 80, for example, an electric double layer capacitor, a conductive polymer aluminum electrolytic capacitor, and a conductive polymer tantalum solid electrolytic capacitor may be used.

The input terminal 73 of the LDO regulator 56 and the DC/DC converter 58 is connected to a reference voltage (ground voltage) terminal 88 via a coil 84 and a MOS transistor 92 in series. The input terminal 73 is also connected to another reference voltage (ground voltage) terminal 89 via the coil 84, a diode 86, and the PLP capacitor 80 in series. The anode terminal of the diode 86 is connected to the coil 84. The cathode terminal of the diode 86 is connected to the second monitoring terminal 74 which is a terminal of the PLP capacitor 80. The terminal of the PLP capacitor 80 connected to the cathode terminal of the diode 86 may be an anode terminal. Another terminal of the PLP capacitor 80 is connected to the reference voltage terminal 89. The other terminal of the PLP capacitor 80 connected to the reference voltage terminal 89 may be a cathode terminal.

The gate terminal of the MOS transistor 92 is connected to the control logic 60. The control logic 60 turns on and off the MOS transistor 92. By repeatedly turning on and off the MOS transistor 92, the coil 84 and the diode 86 step up the voltage of the input terminal 73 (5V) to a third voltage, for example, 28V. That is, the MOS transistor 92, the coil 84, and the diode 86 form a step-up DC/DC converter. The step-up DC/DC converter may be integrated with the DC/DC converter 58. The output voltage of the step-up DC/DC converter is variable. In this embodiment, the maximum value of the output voltage is 28V.

The PLP capacitor 80 charges energy in accordance with the stepped-up voltage (28V) from the step-up DC/DC converter while the first voltage of 5V is supplied from the host 12 to the power supply circuit 22.

As the charging voltage becomes higher, the PLP capacitor 80 is short-circuited more easily. Therefore, the upper limit of the charging voltage allowed to be supplied to the PLP capacitor 80 is determined. Here, the maximum allowable voltage that can be supplied to the PLP capacitor 80 is 28V.

The terminal 74 of the PLP capacitor 80 or the cathode terminal of the diode 86 is also connected to the control logic 60. The terminal 74 of the PLP capacitor 80 monitors the charging voltage of the PLP capacitor 80. The terminal 74 of the PLP capacitor 80 is also referred to as the second monitoring terminal 74.

The second monitoring terminal 74 is connected to the input terminal of a step-down DC/DC converter 90. The step-down DC/DC converter 90 steps down the input voltage at a variable step-down ratio corresponding to the input voltage, and normally outputs, for example, 5.3V. The output terminal of the step-down DC/DC converter 90 is connected to the input terminal 73 of the LDO regulator 56 and the DC/DC converter 58 via a coil 94 and a diode 96 in series.

The anode terminal of the diode 96 is connected to the coil 94. The cathode terminal of the diode 96 is connected to the input terminal 73. A connection point of the coil 94 and the diode 96 (or the anode terminal of the diode 96) is connected to a reference voltage (ground voltage) terminal 99 via a capacitor 98.

The threshold voltage of the diode 96 is, for example, 0.4V. Therefore, when the voltage of the input terminal 73 of the LDO regulator 56 and the DC/DC converter 58, or the cathode terminal of the diode 96, is 5V, the diode 96 is in the off-state since the anode terminal of the diode 96 is 5.3V.

The control logic 60 transmits information indicating various states of the power supply circuit 22 to the controller 18 in accordance with a predetermined communication standard. The communication standard between the control logic 60 and the controller 18 may be, for example, a serial communication standard. An example of the serial communication standard is the inter-integrated circuit (I2C) method. An I2C interface (I2C I/F) 64 is connected to the control logic 60. The I2C I/F 64 communicates with the controller 18 in response to a control signal from the control logic 60. The control logic 60 supplies control signals to the load switch 54, the LDO regulator 56, and the DC/DC converter 58 in response to the control signal from the controller 18.

<Operation Example of Power Supply Circuit>

FIG. 3 is a flowchart illustrating an example of the operation of the power supply circuit 22. FIGS. 4A to 4E show a timing chart illustrating an example of the operation of the power supply circuit 22. An example of the operation related to a countermeasure for the peak current and the PLP function will be described with reference to FIGS. 3 and 4A to 4E.

When a voltage is supplied to the control logic 60 via a terminal (not illustrated), the control logic 60 starts its operation. When the control logic 60 starts the operation, the control logic 60 monitors the voltage of the first monitoring terminal 72, the voltage of the second monitoring terminal 74, and the voltage of the input terminal 73 of the LDO regulator 56 and the DC/DC converter 58, and turns on the load switch 54.

It is assumed that the first voltage (5V) from the host 12 is not supplied to the input terminal 51 of the power supply circuit 22 when the operation starts. Therefore, as illustrated in FIGS. 4A and 4D, the voltage of the first monitoring terminal 72 and the voltage of the second monitoring terminal 74 are both 0V. Although not illustrated, the voltage of the input terminal 73 of the LDO regulator 56 and the DC/DC converter 58 is also 0V.

When the operation starts, the control logic 60 turns off the MOS transistor 82 and the MOS transistor 92, respectively as illustrated in FIGS. 4B and 4C. Although not illustrated, the control logic 60 also stops the switching operation of the LDO regulator 56 and the DC/DC converter 58.

Thus, the LDO regulator 56 and the DC/DC converter 58 do not generate a voltage, and the SSD 14 is in a non-operation state.

Since the voltage of the second monitoring terminal 74 is 0V, the output voltage of the step-down DC/DC converter 90 is 0V. Since the voltage difference (0V) between the input terminal 73 and the output terminal of the step-down DC/DC converter 90 is less than the threshold voltage (0.4V) of the diode 96, the diode 96 is in the off-state as illustrated in FIG. 4E.

The control logic 60 determines whether or not the voltage of the first monitoring terminal 72 is equal to or higher than the start-up threshold voltage (S102 in FIG. 3). The start-up threshold voltage is set to the first voltage to be supplied to the input terminal 51 by the host 12, for example, 5V. When the determination result in S102 is NO, the determination process in S102 is repeatedly executed.

The first voltage (5V) from the host 12 is supplied to the input terminal 51, and the first voltage of the input terminal 51 is supplied to the first monitoring terminal 72 via the fuse 52 and the load switch 54. When the voltage of the first monitoring terminal 72 becomes 5V as illustrated in FIG. 4A, the determination result of S102 in FIG. 3 becomes YES.

When the determination result in S102 is YES, the control logic 60 turns on the MOS transistor 82 as illustrated in FIG. 4B, and supplies the first voltage (5V), which is supplied from the host 12 to the first monitoring terminal 72, to the input terminal 73 of the LDO regulator 56 and the DC/DC converter 58 (S104 in FIG. 3). The control logic 60 further adjusts the ratio between the on-period and the off-period of the switching element in the LDO regulator 56 and the DC/DC converter 58, in accordance with the voltage intended to be generated and the voltage of the input terminal 73. As a result, the LDO regulator 56 and the DC/DC converter 58 supply the plurality of second voltages to the flash memory 16, the controller 18, and the DRAM 20.

As illustrated in FIG. 4C, the control logic 60 periodically turns on and off the MOS transistor 92, steps up the first voltage (5V) supplied from the host 12 to the first monitoring terminal 72 up to the third voltage, and charges energy in the PLP capacitor 80 by the third voltage (S106 in FIG.

3). Since the third voltage depends on the ratio between the on-period and the off-period of the MOS transistor 92, the control logic 60 sets the ratio between the on-period and the off-period of the MOS transistor 92 so that the third voltage becomes 28V.

The process of S104 and the process of S106 may be executed in the reverse order, or both the processes may be simultaneously executed.

With the process of S104, the LDO regulator 56 and the DC/DC converter 58 step down the first voltage (5V) from the host 12 to generate the second voltages required for the operations of the devices in the SSD 14, and supply the second voltages to the devices. During this time, the step-up DC/DC converter including the coil 84, the diode 86, and the MOS transistor 92 steps up the first voltage (5V) from the host 12 up to the third voltage and charges energy in the PLP capacitor 80. The energy to be charged is $(1/2)CV^2$. Here, "C" indicates the capacitance of the PLP capacitor 80, and "V" indicates the third voltage (28V).

When a specific operation such as writing into the flash memory 16 is performed in the SSD 14, the current consumption of the SSD 14 may increase momentarily. The current consumption at this time is referred to as the peak current. The capacity of the power supply of the host 12 is designed to have a margin for supplying the peak current of the SSD 14. However, it is not possible to supply the peak current larger than expected. The host 12 may shut down when the peak current is excessive.

For example, it is assumed that five SSDs 14 are connected to the host 12. The power consumption of each of the SSDs 14 is assumed to be 12 W. The host 12 supplies power of 12V and 1 A to each of the SSDs 14. Also it is assumed that the power that can be supplied by the host 12 is 100 W. Since 100 W is larger than 60 W (=12 W*5), the host 12 can stably supply the rated voltage of 12V to the SSDs 14 as long as each of the SSDs 14 consumes the power of 12 W. Here, it is assumed that a peak current of 2 A is required in each of the SSDs 14. When the output voltage of the host 12 remains at the rated value of 12V, the total power consumption 120 W (=2 A*12V*5) of the five SSDs 14 exceeds the power (100 W) that can be supplied by the host 12. Therefore, when the peak current is required, the host 12 reduces the power supplied to each of the SSDs 14 to, for example, 20 W. Therefore, the power required by each of the SSDs 14 (24 W) becomes insufficient. The PLP capacitor 80 in the embodiment uses the charged energy to supplement the shortage of power (4 W=24 W−20 W) of each of the SSDs 14.

In a data center, a plurality of SSDs 14 may be connected to one server in common. In the plurality of SSDs 14 processing similar workloads, a possibility that a peak current is required at the same timing among the plurality of SSDs 14 is high.

As described above, even though the power supply itself of the host 12 is normal, the first voltage supplied from the host 12 may drop due to the peak current.

In the power supply circuit 22 in a comparative example, when the voltage of the first monitoring terminal 72 becomes equal to or lower than a threshold voltage (for example, 4.8V) while the power source is not shut down, the MOS transistor 82 and the MOS transistor 92 are turned off, and the charging of the PLP capacitor 80 is stopped. Thus, the energy of the PLP capacitor 80 is discharged, and the voltage depending on the discharged energy is supplied to the input terminal 73 of the LDO regulator 56 and the DC/DC converter 58. The LDO regulator 56 and the DC/DC converter 58 generate the voltages (second voltages) required to drive the SSD 14 while the voltage is supplied by the discharge energy. With such a PLP function, the SSD 14 can write data being written, into the flash memory 16. However, the PLP function in this case is an erroneous operation since the power source is not shut down. It is possible to prevent the erroneous operation of the PLP function by increasing a difference between the first voltage supplied from the host 12 and the threshold voltage, but it may be difficult to design to increase the difference. For example, in some types of SSDs 14, the difference between the first voltage supplied from the host 12 and the second voltage supplied to each device in the SSD 14 is small. In this case, the threshold voltage is to be designed to be close to the first voltage supplied from the host 12.

According to the embodiment, when the peak current is required, the discharged energy of the PLP capacitor 80 is used to compensate for the drop of the first voltage supplied from the host 12. Specifically, the output voltage (5.3V) of the step-down DC/DC converter 90 is supplied as a compensation voltage to the input terminal 73 of the LDO regulator 56 and the DC/DC converter 58.

As illustrated in FIG. 4A, the voltage of the first monitoring terminal 72 is 5V while the power supply circuit 22 generates the second voltages by the processing of S104. Thus, the cathode terminal of the diode 96 is also 5V. As illustrated in FIG. 4D, the voltage of the second monitoring terminal 74 is 28V, and the voltage of the anode terminal of the diode 96, which is the output voltage of the step-down DC/DC converter 90, is 5.3V. The voltage across the anode and the cathode of the diode 96 is 0.3V which is lower than the threshold voltage (0.4V) of the diode 96, and the diode 96 is in the off-state. Therefore, no current flows from the output of the step-down DC/DC converter 90 to the diode 96, and the energy of the PLP capacitor 80 is not consumed.

When the peak current of the SSD 14 is required, the first voltage supplied from the host 12 to the input terminal 51 drops. That is, as illustrated in FIG. 4A, the voltage of the first monitoring terminal 72 drops. When the voltage of the first monitoring terminal 72 drops to be equal to or lower than a first threshold voltage (for example, 4.9V), the voltage of the cathode terminal of the diode 96 also drops to be equal to or lower than the first threshold voltage (4.9V). The voltage at the anode terminal of the diode 96, which is the output voltage of the step-down DC/DC converter 90, is 5.3V. Therefore, the voltage across the anode and the cathode of the diode 96 becomes equal to or higher than the threshold voltage of the diode 96 (0.4V), and as illustrated in FIG. 4E, the diode 96 is turned on. Therefore, a current depending on the energy of the PLP capacitor 80 flows from the output of the step-down DC/DC converter 90 to the input terminal 73 of the LDO regulator 56 and the DC/DC converter 58 via the diode 96. Therefore, the compensation voltage depending on the discharged energy of the PLP capacitor 80 is supplied to the input terminal 73. Thus, as illustrated in FIG. 4A, the voltage of the first monitoring terminal 72 returns to 5V. As a result, it is possible to prevent the erroneous operation of the PLP function due to the requirement of the peak current.

While the compensation voltage depending on the discharged energy of the PLP capacitor 80 is supplied to the input terminal 73, the control logic 60 keeps the MOS transistor 92 to be periodically turned on and off. Thus, charging of the PLP capacitor 80 is continued.

When the voltage of the first monitoring terminal 72 returns to 5V, the voltage across the anode and the cathode of the diode 96 becomes 0.3V, which is equal to or lower than the threshold voltage of the diode 96. Therefore, the diode 96 becomes turned off. The current depending on the energy of the PLP capacitor 80 does not flow through the diode 96, and the energy of the PLP capacitor 80 is not consumed any more.

Next, the PLP function will be described. As described above, in the power supply circuit in the comparative example, the voltage of the first monitoring terminal 72 is compared with a threshold voltage to operate the PLP function. According to the embodiment, when the voltage of the first monitoring terminal 72 drops, the voltage depending on the discharged energy of the PLP capacitor 80 is supplied to the input terminal 73 of the LDO regulator 56 and the DC/DC converter 58. As a result, the voltage of the first monitoring terminal 72 returns to the original voltage (5V) and does not drop below the threshold voltage. Therefore, the voltage of the first monitoring terminal 72 is not used to determine the start of the operation of the PLP function.

Further, when the power supply of the host 12 is shut down, the voltage of the first monitoring terminal 72 drops, so that the output voltage of the step-down DC/DC converter 90 is supplied as the compensation voltage to the input terminal 73 of the LDO regulator 56 and the DC/DC converter 58. Therefore, the discharged energy of the PLP capacitor 80 is consumed for the compensation voltage, and the energy for the PLP function is lost.

In the embodiment, the charging voltage of the PLP capacitor 80, which is to be supplied to the terminal of the PLP capacitor 80, that is, the charging voltage of the PLP capacitor 80 monitored by the second monitoring terminal 74 is used to determine the operation start condition of the PLP function. While the power supply circuit 22 supplies the second voltages to the flash memory 16, the controller 18, and the DRAM 20, the control logic 60 determines whether or not the voltage of the second monitoring terminal 74 is equal to or lower than the second threshold voltage (S108 in FIG. 3). The second threshold voltage is set to, for example, 25V.

When the voltage of the second monitoring terminal 74 is not equal to or lower than the second threshold voltage, the determination process of S108 is repeatedly executed.

When the power supply of the host 12 is unintentionally shut down due to power failure or the like, the power from the host 12 is not supplied, and the voltage of the first monitoring terminal 72 drops as illustrated in FIG. 4A. When the voltage of the first monitoring terminal 72 drops to be equal to or lower than the first threshold voltage, the diode 96 is turned on as illustrated in FIG. 4E. Therefore, the PLP capacitor 80 starts discharging, the voltage depending on the discharged energy is supplied to the input terminal 73, and the voltage of the first monitoring terminal 72 returns to 5V as illustrated in FIG. 4A.

As discharging of the PLP capacitor 80 progresses, the voltage of the second monitoring terminal 74 drops as illustrated in FIG. 4D. When the voltage of the second monitoring terminal 74 drops to be equal to or lower than the second threshold voltage (25V), the control logic 60 turns off the MOS transistor 82 (S110 in FIG. 3) as illustrated in FIG. 4B. Thus, the voltage depending on the discharged energy of the PLP capacitor 80 is not supplied to the first monitoring terminal 72, so that the voltage of the first monitoring terminal 72 drops to 0V as illustrated in FIG. 4A. Further, when the voltage of the second monitoring terminal 74 drops to be equal to or lower than the second threshold voltage, the control logic 60 turns off the MOS transistor 92 (S110 in FIG. 3) as illustrated in FIG. 4C. Thus, charging of the PLP capacitor 80 is stopped.

Since the voltage of the first monitoring terminal 72 is 0V, the diode 96 remains in the on-state as illustrated in FIG. 4E, and the voltage depending on the discharged energy of the PLP capacitor 80 is continuously supplied to the LDO regulator 56 and the DC/DC converter 58.

When the discharging of the PLP capacitor 80 further progresses and the voltage of the second monitoring terminal 74 drops to 0V as illustrated in FIG. 4D, the diode 96 is turned off as illustrated in FIG. 4E.

When the voltage of the second monitoring terminal 74 drops to be equal to or lower than the second threshold voltage (for example, 25V), the control logic 60 transmits a notification indicating power shut down to the controller 18 via the I2C I/F 64.

In a case where data being written is stored in the DRAM 20 when the controller 18 receives this notification, the controller 18 writes the data being written, into the flash memory 16. During the writing, the power supply circuit 22 uses the discharged energy of the PLP capacitor 80 to supply the second voltages to the flash memory 16, the controller 18, and the DRAM 20.

Thus, even though the power supply of the host 12 is unintentionally shut down, the controller 18 can write the data that is stored in the DRAM 20 and is being written, into the flash memory 16.

As described above, according to the embodiment, when a peak current is required in the SSD 14, a current depending on the energy of the PLP capacitor 80 flows through the LDO regulator 56 and the DC/DC converter 58. Thus, it is possible to prevent the erroneous operation of the PLP function. Since the charging voltage of the PLP capacitor 80 is monitored to determine the start of the operation of the PLP function, it is possible to appropriately operate the PLP function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, at least one of the PLP capacitor 80 and the MOS transistor 82 may be implemented outside the power supply circuit 22. The accompanying claims and their equivalents are intended to cover such forms or modifications as would fall within the scope and spirit of the inventions.

What is claimed is:

1. A memory system comprising:
   a first terminal;
   a non-volatile memory;
   a capacitor having a second terminal; and
   a power supply circuit having a third terminal and being configured to:
     supply a first voltage to the third terminal on the basis of a voltage supplied to the first terminal;
     generate at least one second voltage using the first voltage;
     supply the at least one second voltage to the non-volatile memory;
     generate a third voltage using the first voltage;
     charge energy in the capacitor by supplying the third voltage to the second terminal;
     upon the voltage supplied to the first terminal being equal to or lower than a first threshold voltage and a voltage of the second terminal being higher than a second threshold voltage, supply a fourth voltage depending on energy of the capacitor to the third terminal while continuing charging of the capacitor; and upon the voltage of the second terminal being equal to or lower than the second threshold voltage, stop charging of the capacitor and supply a fifth voltage depending on the energy of the capacitor to the third terminal, wherein the third voltage is higher than the first voltage, the second threshold voltage is higher than the first threshold voltage, the power supply circuit includes:
a first converter configured to step down the voltage of the second terminal; and
a diode including an anode connected to an output terminal of the first converter and a cathode connected to the third terminal; and a current flows from the anode of the diode to the cathode of the diode when a difference between the voltage of the third terminal and a voltage of the output terminal of the first converter is equal to or more than a third threshold voltage.

2. The memory system according to claim 1, wherein the second terminal is an anode terminal of the capacitor.

3. The memory system according to claim 1, wherein the power supply circuit includes a second converter configured to step up the first voltage to generate the third voltage, and the second terminal is connected to an output terminal of the second converter.

4. The memory system according to claim 3, wherein the power supply circuit is further configured to:
upon the voltage of the second terminal being equal to or lower than the second threshold voltage, stop a step-up operation of the second converter.

5. The memory system according to claim 1, further comprising:
a volatile memory; and
a controller configured to control writing of data into the non-volatile memory, wherein
the controller is configured to store the data in the volatile memory,
the power supply circuit is further configured to transmit a notification signal to the controller when the voltage of the second terminal becomes equal to or lower than the second threshold voltage, and
the controller is configured to write the data stored in the volatile memory into the non-volatile memory in response to the notification signal.

6. The memory system according to claim 5, wherein the capacitor has a capacitance large enough to generate power for the controller to write the data into the non-volatile memory.

7. The memory system according to claim 1, further comprising:
a metal-oxide-semiconductor field-effect transistor (MOSFET) connected to the first terminal and the third terminal, wherein
the power supply circuit is further configured to:
upon the voltage supplied to the first terminal being higher than the first threshold voltage, by turning on the MOSFET, supply the first voltage to the third terminal; and
upon the voltage of the second terminal being equal to or lower than the second threshold voltage, by turning off the MOSFET, stop charging of the capacitor and stop supplying the first voltage to the third terminal.

8. The memory system according to claim 1, further comprising a fuse configured to prevent an overcurrent from flowing into the first terminal.

9. A power supply circuit configured to be used in a memory system, the memory system including a first terminal, a non-volatile memory, and a capacitor having a second terminal, the power supply circuit comprising:
a third terminal;
a control circuit configured to:
supply a first voltage to the third terminal on the basis of a voltage supplied to the first terminal;
generate at least one second voltage using the first voltage;
supply the at least one second voltage to the non-volatile memory;
generate a third voltage using the first voltage;
charge energy in the capacitor by supplying the third voltage to the second terminal;
upon the voltage supplied to the first terminal being equal to or lower than a first threshold voltage and a voltage of the second terminal being higher than a second threshold voltage, supply a fourth voltage depending on energy of the capacitor to the third terminal while continuing charging of the capacitor; and
upon the voltage of the second terminal being equal to or lower than the second threshold voltage, stop charging of the capacitor and supply a fifth voltage depending on the energy of the capacitor to the third terminal;
a first converter configured to step down the voltage of the second terminal; and
a diode including an anode connected to an output terminal of the first converter and a cathode connected to the third terminal, wherein
the third voltage is higher than the first voltage, and
the second threshold voltage is higher than the first threshold voltage,
a current flows from the anode of the diode to the cathode of the diode when a difference between the voltage of the third terminal and a voltage of the output terminal of the first converter is equal to or more than a third threshold voltage.

10. The power supply circuit according to claim 9, wherein
the second terminal is an anode terminal of the capacitor.

11. The power supply circuit according to claim 9, further comprising:
a second converter configured to step up the first voltage to generate the third voltage, and
the second terminal is connected to an output terminal of the second converter.

12. The power supply circuit according to claim 11, wherein
the control circuit is further configured to:
upon the voltage of the second terminal being equal to or lower than the second threshold voltage, stop a step-up operation of the second converter.

13. The power supply circuit according to claim 9, wherein
the memory system further comprises a controller configured to control writing of data into the non-volatile memory, wherein the control circuit is further configured to transmit a notification signal to the controller when the voltage of the second terminal becomes equal to or lower than the second threshold voltage.

14. The power supply circuit according to claim 13, wherein
the capacitor has a capacitance large enough to generate power for the controller to write the data into the non-volatile memory.

15. The power supply circuit according to claim 9, wherein
the memory system further comprises a metal-oxide-semiconductor field-effect transistor (MOSFET) connected to the first terminal and the third terminal, wherein
the control circuit is further configured to:
upon the voltage supplied to the first terminal being higher than the first threshold voltage, by turning on the MOSFET, supply the first voltage to the third terminal; and
upon the voltage of the second terminal being equal to or lower than the second threshold voltage, by turning off the MOSFET, stop charging of the capacitor and stop supplying the first voltage to the third terminal.

16. The power supply circuit according to claim 9, further comprising an interface circuit configured to communicate with a controller of the memory system.

17. A memory system comprising:
a first terminal;
a non-volatile memory;
a capacitor having a second terminal; and
a power supply circuit having a third terminal and being configured to:
supply a first voltage to the third terminal on the basis of a voltage supplied to the first terminal;
generate at least one second voltage using the first voltage;
supply the at least one second voltage to the non-volatile memory;
generate a third voltage using the first voltage;
charge energy in the capacitor by supplying the third voltage to the second terminal;
upon the voltage supplied to the first terminal being equal to or lower than a first threshold voltage and a voltage of the second terminal being higher than a second threshold voltage, supply a fourth voltage depending on energy of the capacitor to the third terminal while continuing charging of the capacitor;
upon the voltage of the second terminal being equal to or lower than the second threshold voltage, stop charging of the capacitor and supply a fifth voltage depending on the energy of the capacitor to the third terminal; and
a metal-oxide-semiconductor field-effect transistor (MOSFET) connected to the first terminal and the third terminal, wherein
the third voltage is higher than the first voltage,
the second threshold voltage is higher than the first threshold voltage, and
the power supply circuit is further configured to:
upon the voltage supplied to the first terminal being higher than the first threshold voltage, by turning on the MOSFET, supply the first voltage to the third terminal; and
upon the voltage of the second terminal being equal to or lower than the second threshold voltage, by turning off the MOSFET, stop charging of the capacitor and stop supplying the first voltage to the third terminal.

18. The memory system according to claim 17, wherein the second terminal is an anode terminal of the capacitor.

19. The memory system according to claim 17, wherein the power supply circuit includes:
a first converter configured to step down the voltage of the second terminal; and
a diode including an anode connected to an output terminal of the first converter and a cathode connected to the third terminal.

20. The memory system according to claim 17, wherein the power supply circuit includes a second converter configured to step up the first voltage to generate the third voltage, and
the second terminal is connected to an output terminal of the second converter.

21. The memory system according to claim 20, wherein the power supply circuit is further configured to:
upon the voltage of the second terminal being equal to or lower than the second threshold voltage, stop a step-up operation of the second converter.

22. The memory system according to claim 17, further comprising:
a volatile memory; and
a controller configured to control writing of data into the non-volatile memory, wherein
the controller is configured to store the data in the volatile memory,
the power supply circuit is further configured to transmit a notification signal to the controller when the voltage of the second terminal becomes equal to or lower than the second threshold voltage, and
the controller is configured to write the data stored in the volatile memory into the non-volatile memory in response to the notification signal.

23. The memory system according to claim 22, wherein the capacitor has a capacitance large enough to generate power for the controller to write the data into the non-volatile memory.

24. The memory system according to claim 17, further comprising a fuse configured to prevent an overcurrent from flowing into the first terminal.

25. A power supply circuit configured to be used in a memory system, the memory system including a first terminal, a non-volatile memory, and a capacitor having a second terminal, the power supply circuit comprising:
a third terminal; and
a control circuit configured to:
supply a first voltage to the third terminal on the basis of a voltage supplied to the first terminal;
generate at least one second voltage using the first voltage;
supply the at least one second voltage to the non-volatile memory;
generate a third voltage using the first voltage;
charge energy in the capacitor by supplying the third voltage to the second terminal;
upon the voltage supplied to the first terminal being equal to or lower than a first threshold voltage and a voltage of the second terminal being higher than a second threshold voltage, supply a fourth voltage depending on energy of the capacitor to the third terminal while continuing charging of the capacitor; and upon the voltage of the second terminal being equal to or lower than the second threshold voltage, stop charging of the capacitor and supply a fifth voltage depending on the energy of the capacitor to the third terminal, wherein the third voltage is higher than the first voltage, the second threshold voltage is higher than the first threshold voltage, the memory system further comprises a metal-oxide-semiconductor field-effect transistor (MOSFET) connected to the first terminal and the third terminal, and the control circuit is further configured to:

upon the voltage supplied to the first terminal being higher than the first threshold voltage, by turning on the MOSFET, supply the first voltage to the third terminal; and upon the voltage of the second terminal being equal to or lower than the second threshold voltage, by turning off the MOSFET, stop charging of the capacitor and stop supplying the first voltage to the third terminal.

26. The power supply circuit according to claim 25, wherein the second terminal is an anode terminal of the capacitor.

27. The power supply circuit according to claim 25, further comprising:

a first converter configured to step down the voltage of the second terminal; and a diode including an anode connected to an output terminal of the first converter and a cathode connected to the third terminal.

28. The power supply circuit according to claim 25, further comprising:

a second converter configured to step up the first voltage to generate the third voltage, and the second terminal is connected to an output terminal of the second converter.

29. The power supply circuit according to claim 28, wherein the control circuit is further configured to:

upon the voltage of the second terminal being equal to or lower than the second threshold voltage, stop a step-up operation of the second converter.

30. The power supply circuit according to claim 25, wherein the memory system further comprises a controller configured to control writing of data into the non-volatile memory, wherein the control circuit is further configured to transmit a notification signal to the controller when the voltage of the second terminal becomes equal to or lower than the second threshold voltage.

31. The power supply circuit according to claim 30, wherein the capacitor has a capacitance large enough to generate power for the controller to write the data into the non-volatile memory.

32. The power supply circuit according to claim 25, further comprising an interface circuit configured to communicate with a controller of the memory system.

* * * * *